United States Patent [19]

Anderson

[11] Patent Number: 5,014,016

[45] Date of Patent: May 7, 1991

[54] SWITCHING AMPLIFIER

[75] Inventor: James R. Anderson, Chicago, Ill.

[73] Assignee: Beltone Electronics Corporation, Chicago, Ill.

[21] Appl. No.: 337,261

[22] Filed: Apr. 13, 1989

[51] Int. Cl.$^5$ .............................................. H03F 3/38
[52] U.S. Cl. ...................................... 330/10; 330/251
[58] Field of Search .................. 307/490, 494; 328/60; 330/10, 146, 207 A, 251

[56] References Cited

U.S. PATENT DOCUMENTS

| | | | |
|---|---|---|---|
| 3,995,114 | 11/1976 | Marschinke | 330/265 X |
| 4,016,501 | 4/1977 | Jasinski et al. | 330/10 |
| 4,068,090 | 1/1978 | Komatsu et al. | 330/277 X |
| 4,162,455 | 7/1979 | Birt | 330/10 |
| 4,178,556 | 12/1979 | Attwood | 330/10 |
| 4,240,036 | 12/1980 | Kohler | 330/10 |
| 4,390,849 | 6/1983 | Niskin | 330/207 A X |
| 4,463,318 | 7/1984 | Kaplan | 330/251 |
| 4,592,087 | 5/1986 | Killion | 381/68 |
| 4,689,819 | 8/1987 | Killion | 381/68 |

OTHER PUBLICATIONS

Comments On "Design Parameters Important for the Optimization of Very-High Fidelity PWM (Class D) Audio Amplifiers", J. Audio Eng. Soc., vol. 33, Oct. 1985.
A Set of 4 IC's in CMOS Technology for a Programmable Hearing Aid, F. Callias et al., IEEE 1988 Custom Integrated Circuits Conference.
A Set of Four IC's in CMOS Technology for a Programmable Hearing Aid, Callias et al., 1989 IEEE.
An article entitled "PWM Audio Amplifiers", publication date of Dec., 1978, Elector.
An article entitled "Pulse Modulated AF Amplifiers", publication date of Mar., 1963, Wireless World.

Primary Examiner—Steven Mottola
Attorney, Agent, or Firm—Dressler, Goldsmith, Shore, Sutker & Milnamow, Ltd.

[57] ABSTRACT

A high efficiency amplifier circuit includes first and second modulator circuits. The output waveform from the first modulator is modulated by the input electrical signal to be amplified. The output waveform from the second modulator is simultaneously modulated with an inverted representation of the input electrical signal. Outputs from the two modulator circuits are coupled to a push-pull output bridge. The load is coupled across first and second output terminals of the bridge such that a tri-level output representation of the amplified input signal is applied thereto.

63 Claims, 5 Drawing Sheets

SWITCHING AMPLIFIER

FIELD OF THE INVENTION

The invention pertains to methods and apparatus for processing audio signals. More particularly, the invention pertains to a high efficiency switching amplifier useful in a portable battery operated device.

BACKGROUND OF THE INVENTION

High efficiency switching amplifiers usable to amplify audio frequency signals are well known. One such amplifier system is disclosed in U.S. Pat. No. 3,185,768 to Cudahy entitled Amplifier Circuit.

Known switching amplifier systems generate a pulse width modulated switching signal in response to the applied audio input signal. The modulated signal includes components that replicate the audio input signal. In addition, it includes high frequency components associated with the frequency of the switching signal and its harmonics.

The modulated switching signal can be used to provide input signals to solid state switches. The solid state switches provide an output signal to a load.

Where the load has an inductive component, or there is an inductive filter in series with the load, the higher frequency components of the load current will be attenuated.

Because of limitations on the maximum value and the quality of the inductive components there can still be an appreciable current flow associated with the higher frequency components of the output signal. This current flow is especially apparent for small amplitudes of the audio input signal.

The use of an inductive filter is undesirable in that it increases amplifier size and weight. It also increases amplifier cost.

In addition, in the absence of a modulating audio input signal, the switching signal often appears at the load as a square wave. This square wave has an amplitude corresponding to the peak to peak output capability of the amplifier at the frequency of the switching waveform.

Such units tend to be used in a portable, battery powered environments. As a result, it is particularly desirable to minimize size and weight and losses of energy from the battery particularly when the input audio signal has substantially zero amplitude.

SUMMARY OF THE INVENTION

In accordance with the invention, a high efficiency switching amplifier provides an amplified representation of an input signal to a load. The amplifier includes circuitry for generating a selected high frequency clock waveform. The high frequency clock waveform is coupled to first and second pulse width modulators. The input signal to be amplified is also coupled to the two modulators. An input to one of the two modulators is inverted. Each modulator generates a pulse width modulated switching waveform in response to instantaneous values of the input signal.

A push-pull bridge output switching circuit is coupled to the output of each of the modulating circuits. The load is coupled across first and second terminals of the output bridge.

An amplified representation of the audio frequency input signal appears across the first and second output terminals of the push-pull bridge output stage and is delivered to the load. If the load is inductive, the current due to the high frequency components of the pulse width modulated switching signals will be attenuated providing high efficiency.

A particular advantage of the present amplifier is that if the input signal has a value substantially equal to zero, the amplified representation delivered to the load also has a value substantially equal to zero. No pulsed or switching signal is provided to the load in this condition.

The pulse width modulators in one embodiment each include a comparator for comparing the amplitude of the input signal to the amplitude of the high frequency clock waveform. The input to one modulator is an inverted representation of the input electrical signal.

The clock waveform can be a triangularly shaped waveform. Alternately, the clock waveform can be a saw-tooth. In an alternate embodiment of the invention, the high frequency clock input to one of the comparators could be inverted instead of inverting the input electrical signal.

The push-pull, bridge output stage of the amplifier includes four switching elements, such as field effect transistors. The load is coupled across the first and second output terminals of the bridge. As a result of alternately switching various pairs of the switching elements in the bridge, a tri-level output signal can be applied to the load even though only a single source of electrical energy is used to power the amplifier.

In yet another embodiment, the modulators can each include a voltage or current controlled pulse width generator. The high frequency clock signal can be coupled to a clock input to each generator. The input signal can be coupled to the pulse width input of one generator. An inverted input signal can be coupled to the pulse width input of the second generator. The pulse width modulated output sequence from each of the two generators can be coupled to a respective input of the bridge output stage.

In yet another embodiment of the invention, a system for processing an acoustical signal includes circuitry for sensing the acoustical signal and for generating an electrical signal in response thereto. The electrical signal is amplified in a switching amplifier having first and second modulator circuits interconnected as described above. Output from the switching amplifier is coupled to a transducer for converting the amplified electrical signals to an output acoustical signal.

Numerous other advantages and features of the present invention will become readily apparent from the following detailed description of the invention and the embodiments thereof, from the claims and from the accompanying drawings in which the details of the invention are fully and completely disclosed as a part of this specification.

DETAILED DESCRIPTION OF THE PREFERRED EMBODIMENTS

Figure 1:
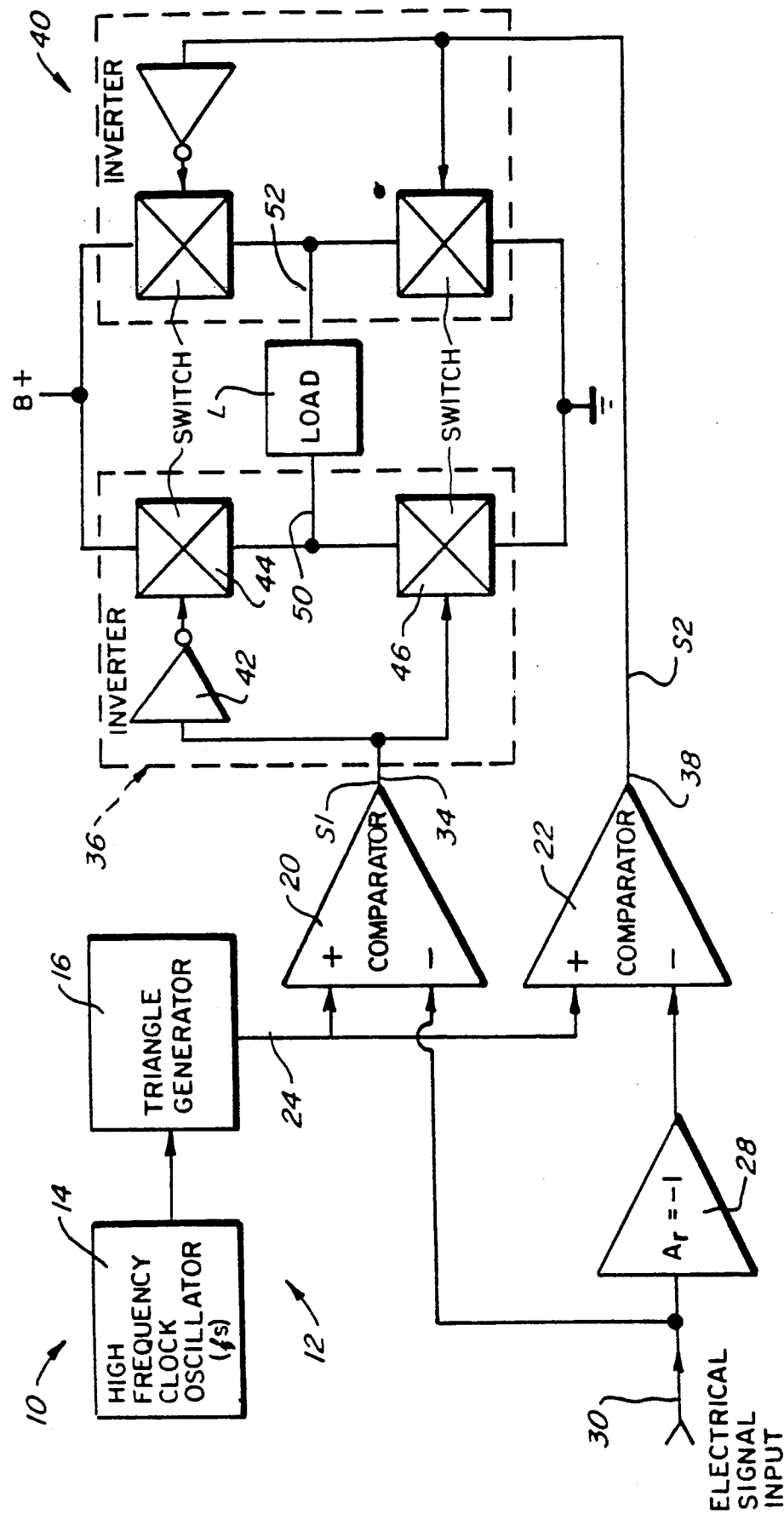
FIG. 1 is a block diagram schematic illustrating a switching amplifier in accordance with the present invention.

While this invention is susceptible of embodiment in many different forms, there is shown in the drawing and will be described herein in detail a specific embodiment thereof with the understanding that the present disclosure is to be considered as an exemplification of the principles of the invention and is not intended to limit the invention to the specific embodiment illustrated.

FIG. 1 illustrates a block diagram of a high efficiency switching amplifier system 10 in accordance with the present invention. The system 10 includes a source 12 of high frequency clock or comparison signals.

The source 12 includes an oscillator 14 which provides a pulse train of electrical signals to a triangular waveform generator 16. The generator 16, in combination with the clock oscillator 14, generate a triangularly shaped waveform of a frequency on the order of 100 kilohertz.

The system 10 includes first and second comparators 20 and 22. Output from the triangular wave generator 16 on a line 24 is supplied to a positive input to each of the comparators 20 and 22.

The system 10 also includes an inverter circuit 28. The inverter circuit 28 can be implemented as an operational amplifier configured to have a gain of minus one.

An electrical input signal to be amplified is coupled to the system 10 at an input port 30. The input port 30 is in turn coupled to a negative input of the comparator 20 and the input of the inverter 28. Output from the inverter 28 is coupled to a negative input of the comparator 22.

As is apparent from the schematic diagram of FIG. 1, comparators 20 and 22 receive the same comparison waveform from the generator 16. However, as a result of the inverter 28, the modulating signals applied to the comparators 20 and 22, respectively, are out of phase.

Output from the comparator 20, a pulse width modulated pulse train S1, on a line 34, is in turn coupled to a first switching element 36. Output from the comparator 22, a pulse width modulated pulse train S2, on a line 38, is coupled to a second switching element 40.

The elements 36, 40 form a four element push-pull output bridge. Since a bridge output stage is incorporated into the amplifier 10, only a single source of electrical energy (B+) is needed to produce a tri-level output signal.

The switching element 36 includes an inverter 42 with an output line coupled to a first transistor switch 44. Output from the comparator 34 is coupled to a second transistor switch 46 in the switching element 36. The switching element 40 is identical to the switching element 36.

Output conducting members 50 and 52 are each coupled to the transistor switches of a respective one of the switching elements 36 and 40. For example, conducting member 50 is coupled to semiconductor switches 44 and 46. The same voltage source, which could be a low voltage mercury battery, on the order of 1.3 volts, or a higher voltage 3 volt battery is coupled to each of the switching elements 36 and 40.

An output signal is generated across the conducting members 50 and 52. A load L can be connected therebetween. As is described subsequently, an amplified representation of the electrical signal applied to the input port 30 appears across the conducting members 50, 52 and hence is applied to the load L.

The switching amplifier system 10 of FIG. 1 is particularly advantageous in that the circuitry thereof substantially reduces the amplitude of high frequency switching components in the output signal appearing across the conducting members 50, 52. As a result, no separate inductive filter is needed if the load L inherently has an inductive impedance. This is usually the case for hearing aid receivers intended to provide an acoustic frequency response within the normal hearing range on the order of 100 hertz to 10,000 hertz.

FIG. 2 illustrates some of the waveforms associated with the system 10 on lines 50, 52 for different modulation conditions. The switching elements 36 and 40 as configured in FIG. 1 and driven by comparators 20 and 22 combine the electrical signals on the line 34 and the line 38 by subtracting one from the other at the conducting members 50 and 52.

Figure 2A:
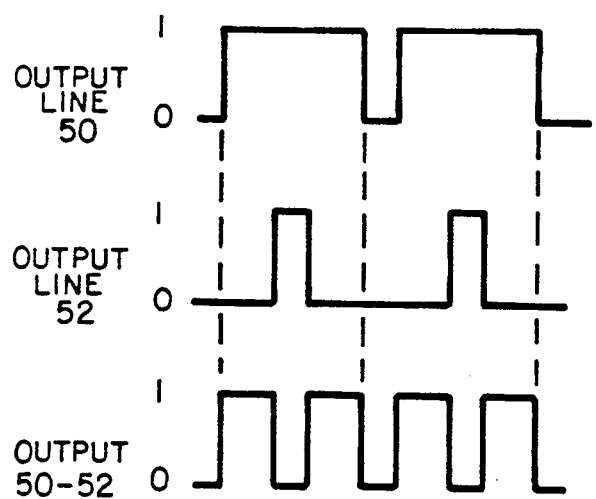
FIGS. 2A, 2B and 2C are a set of graphs illustrating waveforms present in the switching amplifier of FIG. 1 as a function of time.

FIG. 2A illustrates the outputs on the lines 50, 52 where the input electrical signal on the input port 30 produces a 60% positive modulation condition. The output graph of lines 50-52 is the push-pull output signal applied to the Load L. It corresponds to the difference of the signals on the lines 50, 52.

Figure 2B:
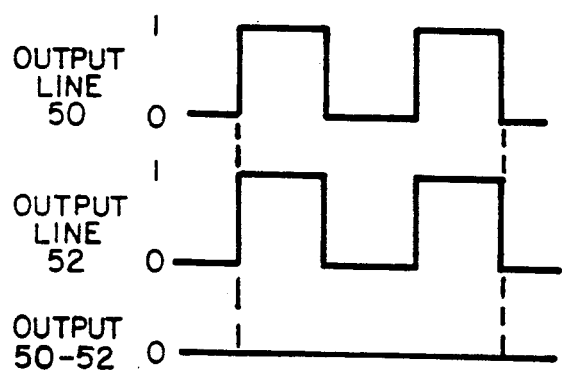

FIG. 2B illustrates the outputs on the lines 50, 52 where the input electrical signal on the input port 30 has a zero instantaneous value thereby producing an unmodulated condition at the Load L. As can be seen from FIG. 2B, the outputs on the lines 50 and 52 are identical.

Hence, the difference between the lines 50 and 52 results in an essentially zero value amplitude signal delivered to the Load L. This zero amplitude signal is particularly advantageous in that no switching signal is applied to the load when the input voltage has a value of zero volts.

Figure 2C:
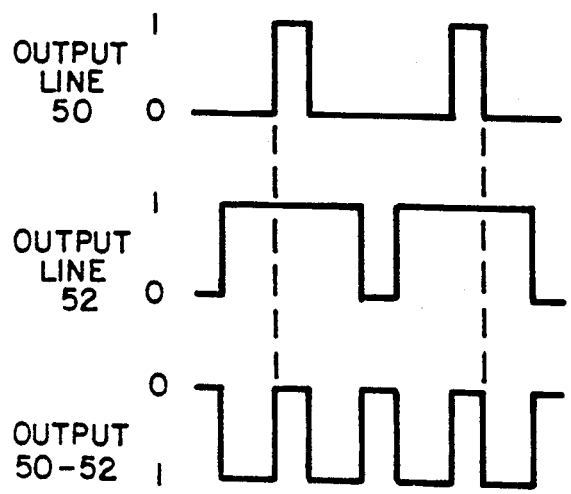

The waveforms of FIG. 2C illustrate the outputs on the lines 50, 52 where the input electrical signal produces a 60% negative modulation condition. The output graph of the lines 50-52 is the push-pull output signal applied to the Load L.

Figure 3:
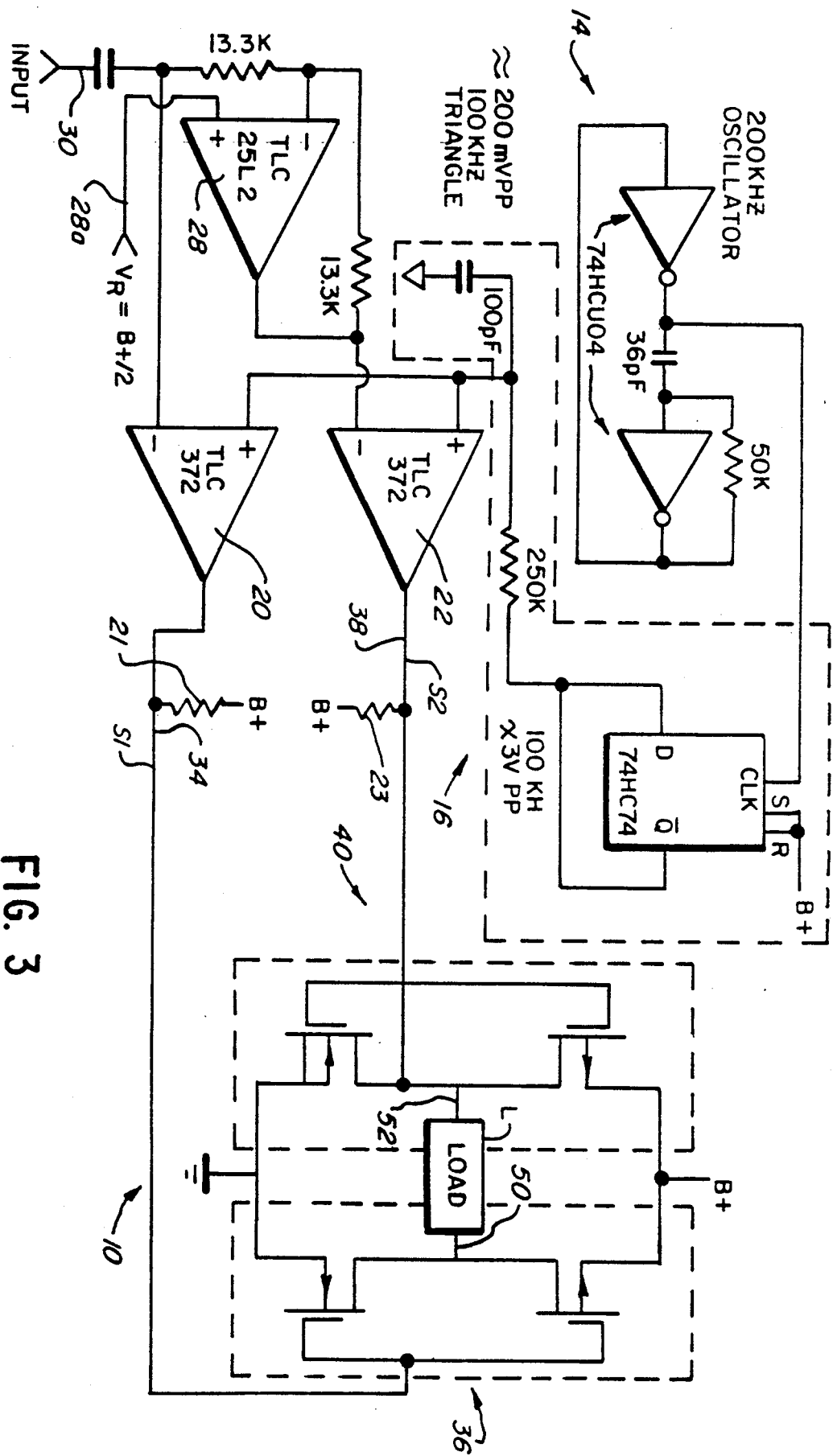
FIG. 3 is a detailed schematic of a switching amplifier in accordance with the present invention.

FIG. 3 is a schematic diagram of a circuit in accordance with the system 10 of FIG. 1. Elements of the amplifier system 10 of FIG. 3 which correspond to elements of FIG. 1 have been assigned the same identification numeral. In the schematic of FIG. 3, the clock oscillator 14 has been implemented with a series coupled pair of inverters. The triangle generator 16 has been implemented with a D flip-flop in combination with a resistor and a capacitor.

The output bridge, composed of switching elements 36 and 40 has been illustrated in FIG. 3 implemented with a commercially available CMOS element type 74HCU04. The comparator elements 20, 22 illustrated in FIG. 3 are open drain output devices which require output load resistors 21 and 23. Alternately, comparators could be used having complementary pull-up and pull-down outputs for lower power dissipation.

Figure 4:
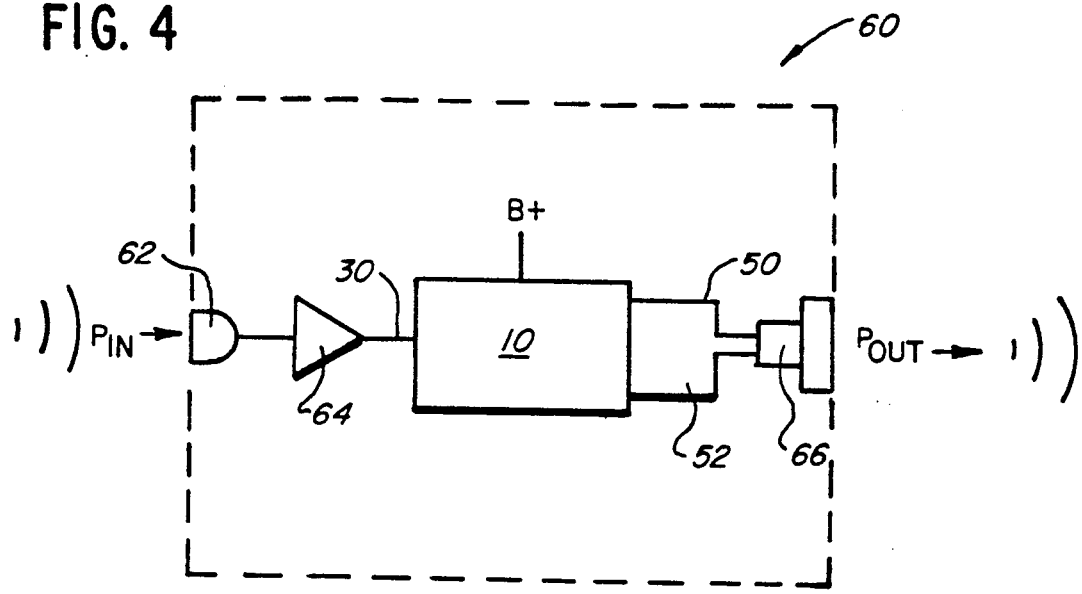
FIG. 4 is a block diagram of a hearing aid and audio processing unit in accordance with the present invention.

FIG. 4 is an overall block diagram of a hearing aid or an acoustic processing system 60. The acoustic processing system 60 includes an input microphone 62. The input microphone 62 converts an acoustic input $P_{IN}$ to a corresponding electrical signal.

The electrical signal from the microphone 62 can be amplified in a preamplifier 64. Output from the preamplifier 64 on the line 30 corresponds to the input to the switching amplifier 10.

Output from the switching amplifier 10 on the lines 50, 52 can be applied to a receiver 66. The receiver 66 converts electrical signals on the lines 50, 52 to an acoustical output $P_{OUT}$.

The amplifier system 10 has several significant advantages when compared to a standard Class D type switching amplifier. One of the advantages of the system 10 is that the high frequency components of the switching signal and its harmonics which are present in the load output voltage on the lines 50, 52 are substantially less than for the case of a standard Class D type switching amplifier. Further, when the input voltage on the input terminal 30 to the system 10 is on the order of zero volts there is substantially no switching signal applied across the output conductors 50, 52 as would be the case of standard Class D switching amplifiers. As a result, for low-level inputs, the system 10 will draw less current from the B+ supply through its output switching elements than will conventional class D-type amplifiers.

Finally, with respect to the detailed implementation of the system 10 illustrated on FIG. 3, variations on the reference voltage coupled to a line 28a of the inverter 28 do not cause a net DC current to flow through the Load L. Variations in the reference voltage $V_R$ appear as only a common mode offset in the output on each of the lines 50, 52. In a standard Class D amplifier, such variations in the value of the quiescent operating point would result in a DC current flowing through the Load L.

Figure 5:
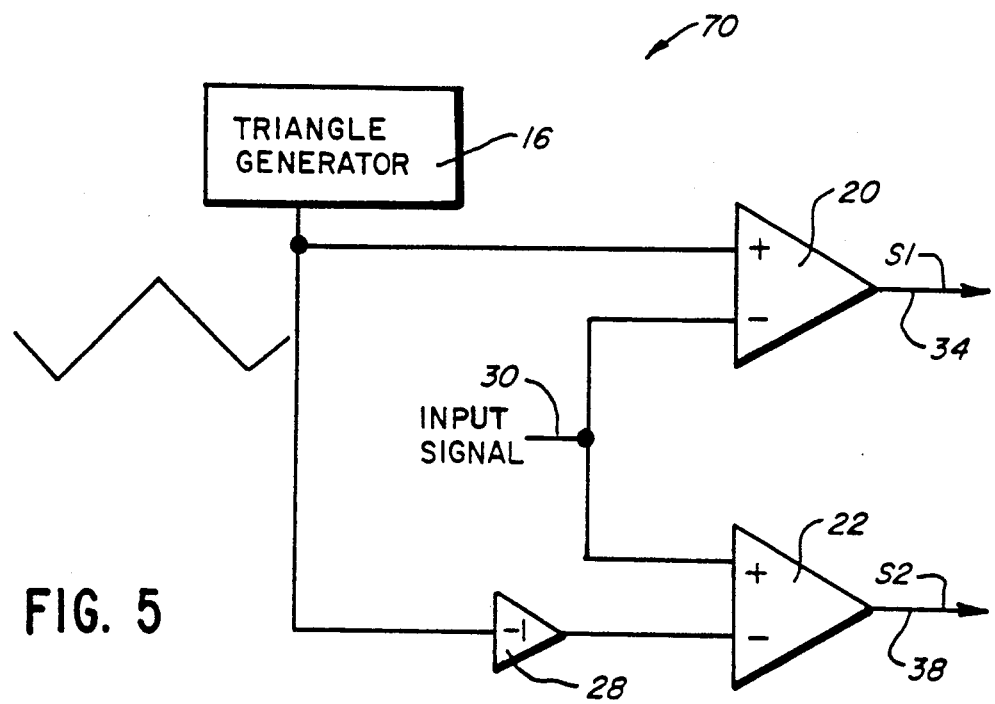
FIG. 5 is a partial block diagram of an alternate modulator configuration usable in a switching amplifier in accordance with the present invention.

An alternate modulator system 70 usable with the amplifier 10 is illustrated in FIG. 5. The modulator system 70 includes the comparators 20 and 22 both of which are coupled to the input port 30. The modulator system 70 also includes the triangular waveform generator 16 and inverting operational amplifier 28. However, in the modulator system 70, the output of the triangular wave generator 16 is inverted before it is coupled to the comparator 22.

Outputs from the comparators 20, 22 the signals S1, S2 on the lines 34 and 38 can be coupled to the push-pull bridge output stage 36, 40 illustrated in FIG. 1.

Figure 6:
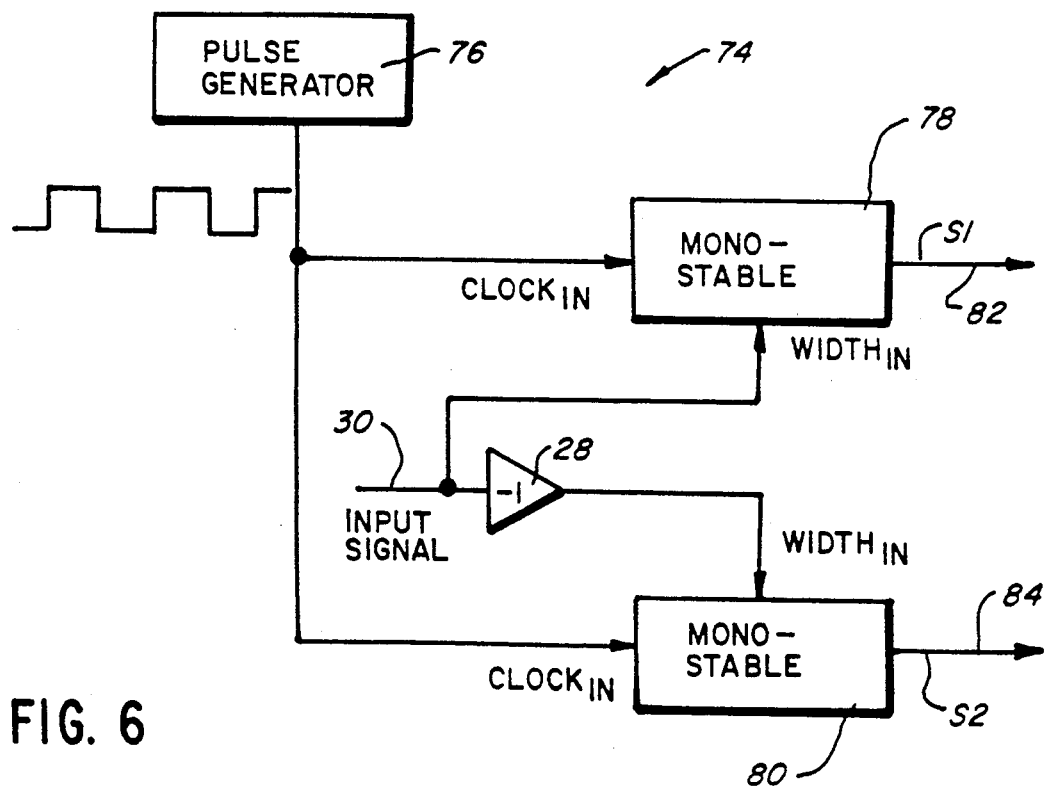
FIG. 6 is a partial block diagram of yet another modulation system usable in a switching amplifier in accordance with the present invention.

FIG. 6 illustrates another modulator system 74. The modulator system 74 includes a source of high frequency clock pulses 76. Output pulses from the source 76 are coupled to clock inputs of variable pulse width generator circuits 78 and 80. The variable pulse width circuits 78 and 80 could be implemented, for example, as mono-stable multivibrators.

As illustrated in FIG. 6, the width input to each of the generators 78 and 80 is coupled respectively to the input signal and the inverted input signal. The two pulse width modulated waveforms S1, S2 generated on the lines 82 and 84 can in turn be coupled to the push-pull bridge output stage 36, 40 of FIG. 1 to drive the load.

Figure 7:
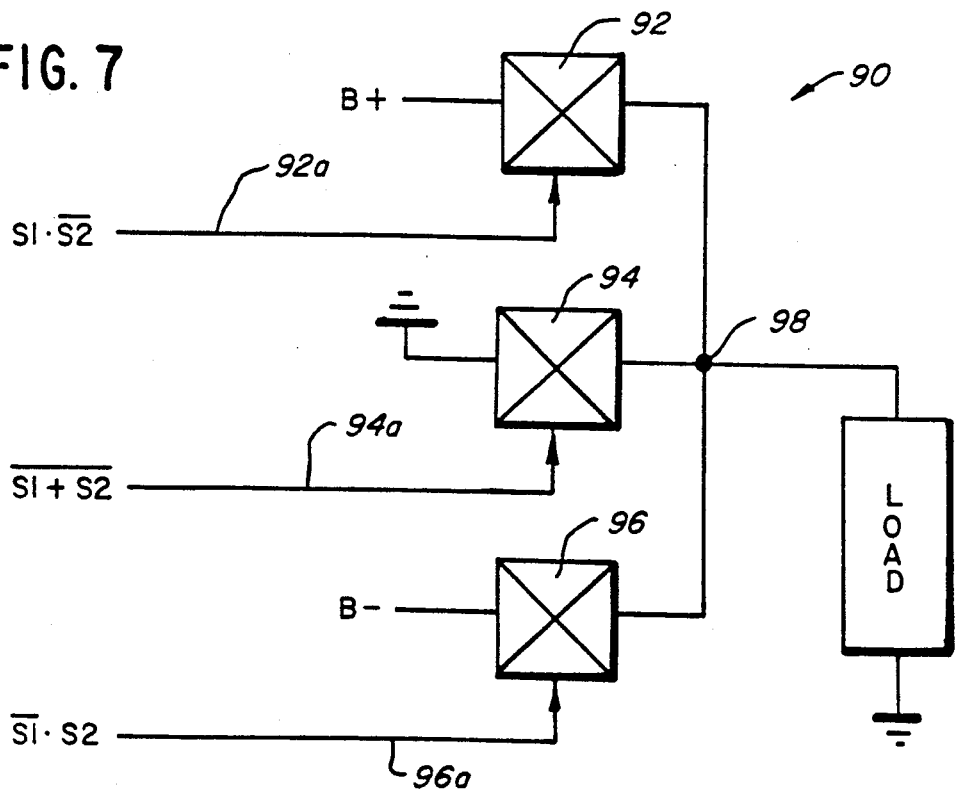
FIG. 7 is an alternate output stage usable with any of the previously noted modulators.

FIG. 7 illustrates an alternate, single ended, output stage 90. The output stage 90 utilizes a positive and a negative source in combination with three non-inverting semiconductor switching elements 92, 94 and 96.

Inputs to the switching elements 92, 94 and 96 are provide via coded input signals on the lines 92a, 94a, and 96a. The coded inputs are derived from pulse width modulated output waveforms S1 and S2 and can be generated using any of the previously discussed modulator systems in combination with conventional digital logic.

The outputs from the switching elements 92-96 are coupled together at an output node 98 and in turn coupled to the load. As was the case with the push-pull output stage 36, 40 previously discussed, the output stage 90 provides a tri-level output to the load. When the instantaneous value of the input electrical signal is substantially zero volts, the output stage 90 delivers substantially zero volts to the load.

It will be understood that the present amplifier system can be used not only for the purpose of amplifying audio frequency signals but for the purpose of amplifying other signals. Other examples include control signals such as could be used to control the velocity of a rotating shaft of a motor. In addition, it will be understood that the present amplifier is useful wherever high efficiency, portable, battery-powered operation is required.

From the foregoing, it will be observed that numerous variations and modifications may be effected without departing from the spirit and scope of the novel concept of the invention. It is to be understood that no limitation with respect to the specific apparatus illustrated herein is intended or should be inferred. It is, of course, intended to cover by the appended claims all such modifications as fall within the scope of the claims.

What is claimed is:

1. A high efficiency circuit for amplifying an applied input electrical signal comprising:
    first means for generating a first pulse sequence having pulse widths modulated in response to the applied input signal;
    second means for generating a second pulse sequence having pulse widths modulated in response to an inverted representation of the applied input signal; and
    means for combining said first and said second pulse sequences.

2. A circuit as in claim 1 including means for inverting the applied input signal.

3. A circuit as in claim 1 including means, coupled to said generating means, for providing a predetermined waveform of a selected frequency.

4. A circuit as in claim 3 with said generating means each including comparison circuitry.

5. A circuit as in claim 3 with said generating means each including variable pulse width generating circuitry.

6. A circuit as in claim 1 with said combining means including push-pull output circuitry.

7. A circuit as in claim 6 with said output circuitry including a bridge output stage.

8. A circuit as in claim 3 with said providing means including means for generating a periodic time-varying waveform that includes, in each period, a region of substantially linear amplitude variation as a function of time.

9. A circuit as in claim 1 with said combining means including single ended output circuitry.

10. A high efficiency switching amplifier for providing an amplified representation of an input signal to a load comprising:

first means for providing a first modulated pulse waveform in response to the input signal;

second means for providing a second modulated pulse waveform modulated out of phase with respect to said first means in response to a representation of the input signal; and switching means coupled to said first and said second means for providing an amplified, representation of the input signal to the load.

11. An amplifier as in claim 10 including:

means for generating a periodic waveform of a selected frequency and with a selected waveshape having at least in part linearly time varying instantaneous values.

12. An amplifier as in claim 11 with said first means including:

means for comparing at least parts of the input signal to at least parts of said periodic waveform and for generating indicia thereof.

13. An amplifier as in claim 12 with said switching means including:

means, responsive to said indicia, for providing, at least in part, an electrical path to the load.

14. An amplifier as in claim 13 with said providing means including first and second members switched out of phase with one another.

15. An amplifier as in claim 10 with said second means including:

means for inverting the input signal.

16. An amplifier as in claim 15 with said second means including:

means for comparing values of said inverted input signal to values of a selected waveform and for generating indicia as a result thereof.

17. An amplifier as in claim 16 including:

means, responsive to said indicia, for providing, at least in part, an electrical path to the load.

18. An amplifier as in claim 11 with said second means including means for inverting said generated waveform.

19. A method of amplifying an electrical signal comprising:

forming a discontinuous, time-varying representation of the signal;

inverting the signal;

forming a discontinuous, time-varying representation of the inverted signal; and combining the two time-varying representations and forming an amplified representation of the electrical signal.

20. A method as in claim 19 with the forming step including:

generating a predetermined selected waveform.

21. A method as in claim 20 with the forming step including:

comparing the input signal to the selected waveform.

22. A method as in claim 19 with the combining step including:

switching an electrical output path to form the amplified representation of the electrical signal.

23. A method as in claim 22 with the switching step including providing at least first and second switchable electrical paths to form the amplified representation of the electrical signal.

24. A method as in claim 20 with the generating step including forming a substantially triangularly shaped switching waveform of a predetermined frequency.

25. A method as in claim 19 with the combining step including minimizing the presence of switching transients when the amplitude of the electrical signal is substantially equal to zero.

26. A method as in claim 19 including in the combining step forming a switched electrical signal.

27. A method of providing an amplified representation of an input signal to a load comprising:

generating a selected waveform;

comparing instantaneous values of the waveform to instantaneous values of the input signal and forming indicia thereof;

inverting the input signal;

comparing instantaneous values of the waveform to instantaneous values of the inverted input signal and forming indicia thereof; and subtracting the two indicia and providing the result to the load.

28. A method as in claim 27 with the subtracting step including switching first and second electrical conducting paths to the load.

29. A high efficiency switching amplifier for providing an amplified representation of an input signal to a load comprising:

means for generating a selected time-varying waveform;

first means for modulating said selected waveform with the input signal;

second means for modulating said selected waveform out of phase with said first means; and switching means, coupled to said first and said second means, for providing an amplified, representation of the input signal to the load including means for minimizing switching transients in the amplified representation.

30. An amplifier as in claim 29 with said first means including:

means for comparing at least parts of the input signal to at least parts of said selected waveform and for generating indicia thereof.

31. An amplifier as in claim 30 with said switching means including:

means, responsive to said indicia, for providing, at least in part, an electrical path to the load.

32. An amplifier as in claim 29 including means for inverting said selected time-varying waveform.

33. An amplifier as in claim 29 with said second means including:

means for inverting the input signal.

34. An amplifier as in claim 33 with said second means including:

means for comparing instantaneous values of said inverted input signal to instantaneous values of said selected waveform and for generating indicia as a result thereof.

35. An amplifier as in claim 29 with said minimizing means providing a substantially zero amplitude switching signal to the load in response to a substantially zero amplitude input signal.

36. An amplifier as in claim 29 with said switching means including a bridge network with the load couplable across first and second output terminals thereof.

37. An amplifier as in claim 29 with said switching means including a single ended output stage.

38. An amplifier as in claim 29 with said modulating means each including a variable pulse width generation circuit.

39. A switching amplifier for amplifying an input electrical signal to be supplied to a load comprising:

means for generating a selected switching signal;

means for sensing values of said switching signal and values of the input electrical signal and for generating a first discontinuous time varying electrical signal in response thereto;

means for inverting said input electrical signal;

means for sensing values of said switching signal and values of said inverted electrical signal and for generating a second discontinuous time-varying electrical signal in response thereto; and means for subtracting said first and said second time-varying signals thereby forming an output signal for the load.

40. A switching amplifier as in claim 39 with said subtracting means including first and second means for switching in response to said first and second time varying signals thereby providing said output signal to the load.

41. A switching amplifier as in claim 39 including means for providing a substantially zero amplitude value output signal in response to a substantially zero amplitude input electrical signal.

42. A switching amplifier as in claim 39 including means for minimizing switching transients in the output signal.

43. An amplifier as in claim 39 with said subtracting means including a bridge network with the load couplable across first and second terminals thereof.

44. A method of amplifying an input electrical signal to be supplied to a load comprising:

generating a first discontinuous time varying electrical signal with pulse widths proportional to values of the input signal;

inverting the input signal;

generating a second discontinuous time-varying electrical signal with pulse widths proportional to values of the inverted input signal; and subtracting the first and the second time-varying signals thereby forming an output signal for the load.

45. A method as in claim 44 with the subtracting step including switching the first and the second time varying signals thereby providing the output signal to the load.

46. A method as in claim 44 including:

providing a substantially zero amplitude value output signal in response to a substantially zero amplitude value input electrical signal.

47. A method as in claim 44 including minimizing the presence of transient switching signals in the output signal.

48. A method as in claim 44 with the generating step including forming a triangular waveform of a selected amplitude and frequency.

49. A method as in claim 44 with the generating step including forming a pulse waveform having substantially rectangularly shaped pulses.

50. A method of processing an acoustic waveform comprising:

detecting the acoustic waveform to be processed;

generating an input electrical signal corresponding to the detected waveform;

generating a first pulse width modulated signal in response to the input electrical signal;

generating a second pulse width modulated signal in opposite phase with respect to the modulation of the first signal;

subtracting the second switching signal from the first forming an output electrical signal; and converting the output electrical signal to an output acoustic waveform.

51. A high efficiency device for amplifying an applied input electrical signal comprising:

first circuitry for generating a first pulse sequence having pulse widths modulated in response to the applied input signal;

second circuitry for generating a second pulse sequence having pulse widths modulated in response to an inverted representation of the applied input signal; and a circuit for combining said first and said second pulse sequences.

52. A device as in claim 51 including an inverter circuit coupled between the applied input signal and to said second circuitry.

53. A device as in claim 51 including a clock source of electrical signals for providing a predetermined waveform of a selected frequency with said waveform coupled to said first and said second circuitry.

54. A device as in claim 51 with said combining circuit including a push-pull output stage.

55. A device as in claim 51 with said combining circuitry including a bridge output stage.

56. A device as in claim 51 with said combining circuit including a single-ended output stage.

57. A device as in claim 53 with said clock source including a periodic time-varying waveform generator with said waveform including in each period, a region of substantially linear amplitude variation as a function of time.

58. A device as in claim 51 with said first and said second circuitry respectively including a first comparator and a second comparator.

59. A device as in claim 51 with said first and said second circuitry respectively including a first mono-stable multivibrator and a second mono-stable multivibrator.

60. A high efficiency switching amplifier for providing an amplified representation of an input signal to a load comprising:

a clock circuit for generating a selected time-varying waveform;

a first modulator for modulating said selected waveform with the input signal;

a second modulator for modulating said selected waveform out of phase with said first modulator; and an output switching stage, coupled to said first and said second modulators, for providing an amplified, representation of the input signal to the load.

61. An amplifier as in claim 60 including an invertor coupled between the input signal and said second modulator.

62. An amplifier as in claim 60 with said output stage including a four element switching bridge.

63. A high efficiency amplifier usable to amplify an applied input signal comprising:

first and second comparators;

an inverter coupled to said second comparator;

a source of electrical signals of a predetermined frequency coupled to said comparators; and an output stage coupled to said comparators with the input signal applied to said first comparator and to said inverter.

* * * * *